(12) United States Patent
Grauvogel

(10) Patent No.: US 8,562,176 B2
(45) Date of Patent: Oct. 22, 2013

(54) LIGHT DIODE WITH COOLING BODY

(75) Inventor: Ulrich Grauvogel, Nürnberg (DE)

(73) Assignee: Eutegra AG, Frankfurt (DE)

( * ) Notice: Subject to any disclaimer, the term of this patent is extended or adjusted under 35 U.S.C. 154(b) by 31 days.

(21) Appl. No.: 13/320,919

(22) PCT Filed: May 19, 2010

(86) PCT No.: PCT/EP2010/003095
§ 371 (c)(1),
(2), (4) Date: Jan. 25, 2012

(87) PCT Pub. No.: WO2010/133365
PCT Pub. Date: Nov. 25, 2010

(65) Prior Publication Data
US 2012/0120660 A1    May 17, 2012

(30) Foreign Application Priority Data
May 20, 2009    (DE) .......................... 10 2009 022 255

(51) Int. Cl.
*F21V 21/00*    (2006.01)
(52) U.S. Cl.
USPC ...... 362/249.02; 362/382; 362/646; 362/652; 362/656
(58) Field of Classification Search
USPC ............... 362/249.02, 249.01, 294, 382, 652, 362/655, 656, 646; 439/574, 575, 232
See application file for complete search history.

(56) References Cited

U.S. PATENT DOCUMENTS

| | | | |
|---|---|---|---|
| 4,471,414 A * | 9/1984 | Savage, Jr. ................... | 362/652 |
| 6,428,189 B1 | 8/2002 | Hochstein | |
| 6,490,161 B1 | 12/2002 | Johnson | |
| 7,036,962 B2 * | 5/2006 | Chan ............................ | 362/407 |
| 7,137,852 B2 * | 11/2006 | Tsukamoto ................... | 439/698 |
| 7,138,667 B2 * | 11/2006 | Barnett et al. ................. | 257/99 |
| 7,296,751 B2 * | 11/2007 | Barber et al. ............ | 235/462.43 |
| 7,341,371 B2 * | 3/2008 | Kuo et al. ..................... | 362/659 |
| 7,806,561 B2 * | 10/2010 | Chen ............................ | 362/265 |
| 8,083,381 B2 * | 12/2011 | Tsai ........................ | 362/311.02 |
| 8,192,068 B2 * | 6/2012 | Kwon et al. .................. | 362/646 |
| 2003/0062413 A1* | 4/2003 | Gardiner et al. ............. | 235/454 |
| 2006/0001361 A1 | 1/2006 | Imai et al. | |
| 2007/0040034 A1* | 2/2007 | Hennick et al. .......... | 235/462.41 |
| 2007/0108784 A1* | 5/2007 | Fiore et al. ................... | 294/66.1 |
| 2007/0152055 A1* | 7/2007 | Barber et al. ................. | 235/454 |
| 2008/0143245 A1 | 6/2008 | Shiue et al. | |
| 2008/0278954 A1 | 11/2008 | Speier | |

FOREIGN PATENT DOCUMENTS

| | | |
|---|---|---|
| GB | 2163598 A | 2/1986 |
| WO | 2006/104325 A1 | 10/2006 |

* cited by examiner

*Primary Examiner* — John A Ward
(74) *Attorney, Agent, or Firm* — Howson & Howson LLP

(57) ABSTRACT

A light diode with a lighting body and connecting wires for operating a light diode are disclosed. The lighting body is connected with a separate cooling body associated to the light diode, wherein the light diode is maintained on the circuit board by means of a clamping mechanism.

16 Claims, 2 Drawing Sheets

LIGHT DIODE WITH COOLING BODY

BACKGROUND

The invention relates to an arrangement of a light diode on a circuit board, which light diode comprises connecting contacts and a lighting body which is connected with a separate cooling body associated to the light diode, wherein the circuit board has an aperture through which the light diode can be guided in such a way that the connecting contacts come in contact with strip conductors, which are situated on the side of the circuit board facing away from the cooling body.

Light diodes are becoming ever more significant for generation of light. With high light yield, known light diodes produce a large amount of heat in the lighting body which must be dissipated. In customary designs of light diodes, this causes problems, because they are soldered like electronic components onto circuit boards. The lighting bodies of light diodes can then be cooled only through convection.

It is additionally known that multiple light diodes are placed on a light diode field on a circuit board for high lighting power. The light diodes are soldered on the circuit board with the strip conductors. There is a problem in that in that if a single light diode fails, the entire light diode field becomes unusable. Replacement of only one light diode involves high expense in such light diode fields.

The defective light diode must be removed and a new one must be soldered on. This has to be done manually, and a danger exists that adjoining light diodes can be damaged or destroyed by the soldering process.

From U.S. Pat. No. 7,138,667 B2, an arrangement of a light diode on a circuit board is known, in which the light diode is held by a clamp on a circuit board. For this, the clamp has retaining tabs that are guided through corresponding openings in the circuit board. With this, a continuation of the light diode projects through the circuit board. U.S. Patent Application Publication No. 2008/0143245 A1 describes another arrangement of a light diode. Here the lighting body of the light diode is guided through an aperture of a substrate and held by the insertion side on the substrate.

SUMMARY

The task that is the basis of the invention is to configure an arrangement of a light diode on a circuit board so that the light diode can be well mounted on the circuit board.

The problem is solved according to the invention in that the light diode is held on the circuit board by means of a clamping mechanism, which comprises a holder that is guided through the aperture of the side of the circuit board facing away from the lighting body, and a retaining clamp that acts in conjunction with the holder and clamps the light diode between itself and the holder, and thus holds on the circuit board and presses the connecting contacts onto the strip conductors of the circuit board. With this, all that is required is that the connecting contacts be pressed onto the strip connectors to hold the light diode on the circuit board for one thing, and to connect the light diode electrically with the strip connector for another. Additional measures are not needed, so that assembly is facilitated.

It is also possible to arrange that the strip conductors on the side of the circuit board turned toward the cooling body. Then first the light diode with the lighting body is guided through the aperture until the connecting contacts abut onto the strip conductors. In this position the light diode is then maintained.

Provision can be made that the base surface of the lighting body be larger than the facing surface of the cooling body, so that in its mounted position the lighting body is braced on the circuit board. By this means the light diode is maintained in particularly secure fashion on the circuit board. But provision can also be made that the lighting body have locking elements by which it is held on the circuit board.

In particular, the arrangement can be made so that the holder can be run through an appropriate aperture in the circuit board from the one side. The holder itself also has an aperture, through which the cooling body of the light diode can be inserted from the other side. Additionally, the holder includes locking mechanisms that act in conjunction with corresponding locking elements of the holding clamp which is mounted from the other side via the holder. Thus the holding clamp encloses the light diode between itself and the holder, and clamps it on the circuit board.

It is appropriate if the retaining clamp presses the connecting contacts onto the strip conductors of the circuit board.

By this means assembly is facilitated, because the light diode is aligned by the holder on the circuit board. The retaining clamp fixes the light diode in the assembled position for use, and electrical contact is made.

It is favorable if, between the retaining clamp and the connecting contacts, there is a layer made of flexible or elastic material, through which the connecting contacts are compressed elastically onto the strip conductor. This flexible material can be an elastomer or silicon. What is achieved thereby is that the connecting contacts are securely brought into electrical connection with the strip conductors.

Additional provision can be made that the retaining clamp is detachably connected with the holder. This is of advantage in that a defective light diode can be replaced using simple means. All that is required is to loosen the retaining clamp and replace the light diode. Then the retaining clamp is again connected with the holder.

Provision is made as per an additional embodiment form of the invention that the retaining clamp has optical media. The optical media can be movably placed on the retaining clamp. What is provided by this is that the optical media are adjustable by means of electromechanical media, especially by means of piezoelectrical elements. What is attained thereby is that each light diode has a separate optical medium assigned to it, for example a lens or shade. Accordingly each light diode can be influenced individually.

Provision can additionally be made that the electromechanical media are controllable via the circuit board. Accordingly, all that is required is that in the area of the light diode, the circuit board has additional strip conductors needed to control the electromechanical media for influencing the optical media. The electrical contacts can also be produced when the retaining clamp is connected with the holder.

Additionally, provision can be made that multiple light diodes be placed on one circuit board. Here the advantage of the invention becomes especially clear, because now it is possible to remove individual defective light diodes from a light diode field and replace them with new ones. Soldering operations are no longer needed, by which the electrical circuit on the circuit board could possibly be damaged. Thus, the fraction rejected is markedly reduced.

The lighting body is connected with a separate cooling body assigned to the light diode. This is advantageous in that the heat generated by operation of the light diode can be dissipated directly from the lighting body through the cooling body.

As a rule, the arrangement is made so that the light diode is mounted on a circuit board. Provision is made here that the cooling body extends out from the light diode from the side opposite where light is emitted, so that, as viewed from above to the side where light is emitted, the cooling body in the installed position is beneath, i.e. of the side of the circuit board facing away from the lighting body. Then only the underside of the circuit board needs to be impinged on by cooling air to dissipate the waste heat.

It is favorable if, between the cooling body and the light body, at least one layer of a thermally conducting material such as a copper or nickel material is placed. This substantially improves heat removal from the lighting body into the cooling body, especially in its widthwise extension. What is also attained thereby is that a metallic through-passage arises from the light body to the cooling body. The cooling body then can be welded to the light body with no further ado. The cooling body can consist of an aluminum material. Such a material is lightweight and poses no problems in processing.

According to a preferred embodiment form of the invention, provision is made that the cooling body have cooling ribs that extend out from the light body. By this means, a relatively large heat transfer surface is formed, which in addition does not lie in the blackout area of the light diode. Thus, no impairment of the optical properties of the light diode is to be feared.

It can be favorable if the surface of the cooling body facing the lighting body is smaller than or equal in size to the underside of the lighting body. What is thereby achieved is that the cooling body, as viewed from above, does not alter the contour of the light diode. Accordingly, the light diode can be situated in the smallest space.

It is appropriate if the connecting wires are placed to the side of the lighting body. With known light diodes, the connecting wires are as a rule placed beneath the lighting body. However, there the cooling body is situated for the affected light diode. Therefore, the connecting wires can extend laterally from the lighting body, so that the electrical connection can be produced with simple means.

The connecting wires can be configured to be pliant or spring-loaded connecting contacts, which can be connected with strip conductors on a circuit board. This is advantageous in that the light diode can be mounted by spring action on the strip conductor. The spring-loaded connecting contacts make possible a good electrical contact, so that current feed is possible without difficulty. It is no longer necessary to solder with the strip conductors.

In an arrangement in which the light diode is guided from the side of the circuit board facing the cooling body through it, the holder can be on this side on the circuit board. For example, the holder can be glued, locked in place or screwed on. Then the light diode is guided from this side through an aperture of the holder until the contacts abut onto the strip conductors. Then the light diode is maintained with the retaining clamp in clamped fashion on the holder and thus on the circuit board. By this means, the electrical contact is also produced. With this arrangement, from the side of the circuit board turned away from the cooling body, only the lighting body of the light diode is visible. This type of assembly is advantageous if the cooling body has a larger cross section as compared to the light diode or its lighting body, so that otherwise it would be possible to guide the cooling body through only if the aperture of the circuit board were larger.

A light diode of the type explained above is advantageous in that the heat can be dissipated well and with no additional auxiliary means. Providing lateral, spring-loaded connecting contacts permits the light diode to be easily assembled on a circuit board. It is no longer required that the light diode be soldered separately on the circuit board. Rather, mere mechanical pressing of the spring-acting connecting contacts onto the strip conductors suffices to ensure a good and secure electrical contact. By this means in addition it is possible that a defective light diode can be replaced without the entire circuit that is on the circuit board needing to be replaced. Also, expensive soldering operations during a replacement of the light diodes are avoided. Lastly, the function of the light diode can be checked during the assembly process, before it is connected with the circuit board. Only after the functional test has been passed does the final locking occur. Until then, a defective light diode can be replaced quickly and without problems.

Additionally, provision can be made for multiple light diodes to be situated on a circuit board. Here the advantage of the invention becomes especially evident, since now it is possible to remove individual defective light diodes from a light diode field and replace them with new ones. Soldering operations are no longer required, by which the electronic circuit on the circuit board could possibly suffer damage. Thus, the fraction rejected is markedly reduced.

In what follows, the invention was explained with the aid of an example in which the light diodes are connected via a holder and a retaining clamp with the strip connector. Naturally it is also possible that the circuit board could have appropriate recesses into which the locking elements of the retaining clamps engage. Therefore, it is possible to do without a separate holder.

The light diode can also be fixed on a flexible circuit board element before it is mounted onto the circuit board. The light diodes are made relatively small, so that for handling, one circuit board element on which the light diode is situated, is favorable. In addition, the flexible circuit board element permits the desired elastic contacting with the circuit board.

BRIEF DESCRIPTION OF THE DRAWINGS

The invention is explained in greater detail in what follows using the schematic drawing. Shown are.

DETAILED DESCRIPTION

Figure 1:
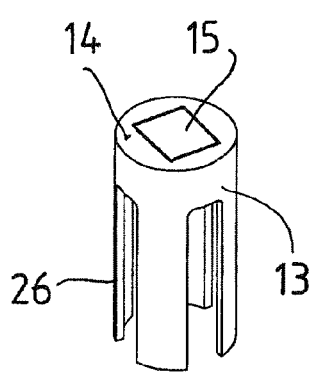
FIG. 1: the cooling body for a light diode as per the invention.
Figure 2:
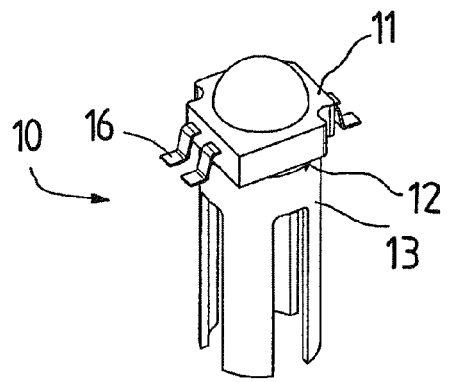
FIG. 2: the light diode and cooling body in an assembled state.
Figure 3:
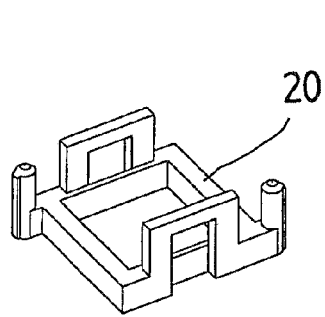
FIG. 3: a holder for the light diode on the circuit board.
Figure 4:
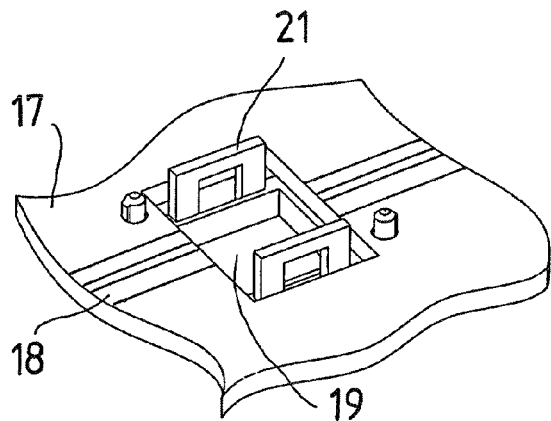
FIG. 4: the circuit board prepared to admit a light diode.

The light diode 10 depicted in the drawing has a lighting body 11 in which the electronic media of a light diode are situated. The light body 11 is situated with its underside 12 on a cooling body 13. In particular the arrangement is made so that essentially light body 11 lies with its entire surface on the upper side 14 of cooling body 13 and is in thermally conducting connection with it. For this, adhesives are known which make possible heat transmission from lighting body 11 to cooling body 13. Provision can be made that cooling body 13, on its surface 14 facing lighting body 11, has a layer or an element 15 made of a thermally conducting material such as aluminum. By this means, support is further provided for the heat transfer from the lighting body to the cooling body. Also, then the lighting body can be soldered to the cooling body.

Lighting body 11 has connecting contacts 16 via which the light diode is supplied with electrical current. In the embodiment example depicted in the drawing, four connecting contacts are provided that project out laterally from the lighting body. By this means, various colors can be generated.

The light diode 10 shown in the drawing can be mounted on a circuit board 17. For one thing, the circuit board supports light diode 10, and serves for guiding the light diode via strip conductors 18 which are in electrical contact with the connecting contacts 16. In particular the arrangement is made so that circuit board 17, in the place at which the light diode is to be placed, has an aperture 19, through which cooling body 13 of light diode 10 fits. If the light diode is guided through the circuit board from the other side, the light diode or at least the lighting body fits through the aperture. A holder 20 is provided which can be mounted from below, the side facing away from lighting body 11 of circuit board 17, in the aperture.

Holder 20 has locking elements 21 that extend upward through the aperture of circuit board 17, which act jointly with locking elements 22 of a retaining clamp 23. Retaining clamp 23 in the mounted position of light diode 10 is pushed from above over the light diode, and the locking elements 22 are linked with locking elements 21 of holder 20. Guiding pins 24 can also be provided which are attached on holder 20 and which act in concert with guiding holes in the retaining clamp not shown in the drawing. This makes possible a precise alignment of the retaining clamp over the holder.

Figure 5:
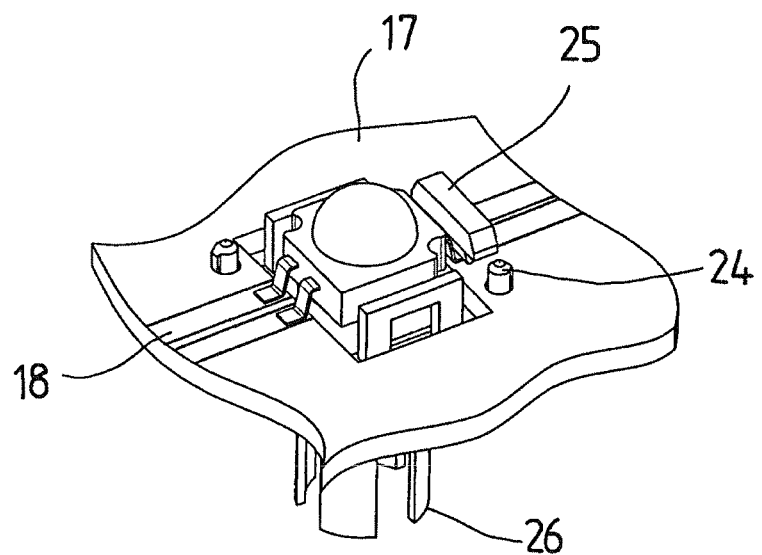
FIG. 5: the light diode as per the invention in the pre-assembled condition on a circuit board.
Figure 6:
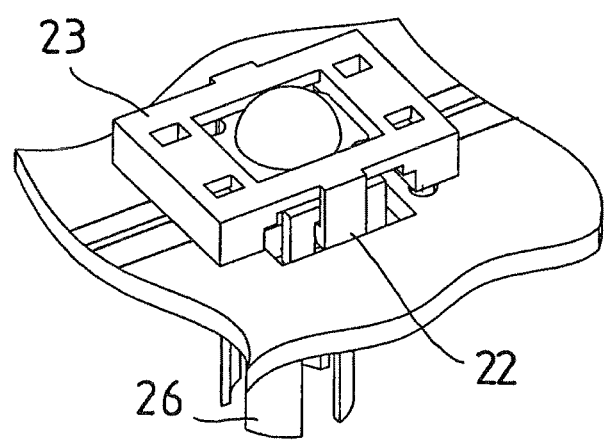
FIG. 6: the light diode as per the invention in the assembled condition on a circuit board.

As is especially evident in FIG. 5, light diode 10 is braced by spring action with the connecting contacts 16 on the strip connectors 18. By this means a secure electrical contact is ensured. In addition, an elastic compressing element 25 can be provided, which runs above the connecting contacts and which is pressed downward onto the circuit board 17 by retaining clamp 23. The free ends of the connecting contacts 16 that run roughly parallel to the circuit board are securely pressed thereby onto the strip conductors 18.

The cooling body can consist of a thermally conducting material, especially of an aluminum material. Cooling ribs 26 can be provided which extend out from lighting body 11. The structural unit consisting of lighting body 11 and cooling body 13 is merely clamped to circuit board 17. A defective light diode can therefore be replaced with no problem.

Additionally, the cooling ribs 26 of cooling body 13 in its mounted state project downwards from circuit board 17. All that is necessary is that this area of the circuit board be impinged on by cooling air to ensure sufficient cooling of the light diode.

The invention claimed is:

1. Arrangement of a light diode on a circuit board (17), which light diode (10) comprises connecting contacts (16) and a lighting body (11), which is connected with a separate cooling body (13) assigned to the light diode, wherein the circuit board has an aperture (19) through which the light diode with the cooling body (13) is guidable so that the connecting contacts (16) come in contact with strip conductors (18) which are situated on a side of the circuit board facing away from the cooling body (13), characterized in that the light diode (10) is maintained by means of a clamping mechanism (20, 23) on the circuit board (17), which comprises a holder (20) that is guided from a side of the circuit board (17) facing away from the lighting body through the aperture (19), and a retaining clamp (23), which acts in conjunction with the holder and clamps the light diode between itself and the holder and thus holds it on the circuit board and presses the connecting contacts onto the strip connectors of the circuit board.

2. Arrangement according to claim 1, characterized in that the retaining clamp has optical media.

3. Arrangement according to claim 2, characterized in that the optical media are movable on the retaining clamp.

4. Arrangement according to claim 2, characterized in that the optical media are adjustable by means of electromechanical media or by means of piezoelements.

5. Arrangement according to claim 4, characterized in that the electromechanical media are controllable via the circuit board.

6. Arrangement of a light diode on a circuit board, which light diode comprises connecting contacts and a lighting body, which is connected with a separate cooling body assigned to the light diode, wherein the circuit board has an aperture through which the light diode is guidable so that the connecting contacts come in contact with strip connectors, which are situated on a side of the circuit board facing away from the lighting body, characterized in that the light diode is maintained by means of a clamping mechanism on the circuit board, which has a holder that is maintained on the circuit board in an area of the aperture on a side with the strip conductors, and a retaining clamp which acts in concert with the holder and clamps the light diode between itself and the holder, and thus holds on the circuit board and presses the connecting contacts onto the strip conductors of the circuit board.

7. Arrangement according to claim 1, characterized in that between the retaining clamp (23) and the circuit board in an area of the connecting contacts, a layer (25) of flexible or elastic material is present, through which the connecting contacts (16) are pressed onto the strip conductors (18).

8. Arrangement according to claim 7, characterized in that the holder (20) has locking elements (21) extending through the aperture (19), which are connected with locking elements (22) of the retaining clamp.

9. Arrangement according to claim 8, characterized in that the retaining clamp (23) is detachably connected with the holder (20).

10. Arrangement according to claim 1, characterized in that the holder (20) has locking elements (21) extending through the aperture (19), which are connected with locking elements (22) of the retaining clamp.

11. Arrangement according to claim 1, characterized in that the retaining clamp (23) is detachably connected with the holder (20).

12. Arrangement according to claim 1, characterized in that multiple light diodes are arranged on a circuit board.

13. Arrangement according to claim 6, characterized in that multiple light diodes are arranged on a circuit board.

14. Arrangement according to claim 6, characterized in that between the retaining clamp (23) and the circuit board in an area of the connecting contacts, a layer (25) of flexible or elastic material is present, through which the connecting contacts (16) are pressed onto the strip conductors (18).

15. Arrangement according to claim 6, characterized in that the holder (20) has locking elements (21) extending through the aperture (19), which are connected with locking elements (22) of the retaining clamp.

16. Arrangement according to claim 6, characterized in that the retaining clamp (23) is detachably connected with the holder (20).

* * * * *